(12) United States Patent
Kaneshige et al.

(10) Patent No.: US 6,757,863 B2
(45) Date of Patent: Jun. 29, 2004

(54) READ CHANNEL CIRCUIT AND METHOD FOR DECODING USING REDUCED-COMPLEXITY ERROR CORRECTION

(75) Inventors: Toshihiko Kaneshige, Yokohama (JP); Tamotsu Ishigaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 395 days.

(21) Appl. No.: 09/953,869

(22) Filed: Sep. 18, 2001

(65) Prior Publication Data

US 2002/0034143 A1 Mar. 21, 2002

(30) Foreign Application Priority Data

Sep. 19, 2000 (JP) ........................................ 2000-283850

(51) Int. Cl.[7] .............................................. H03M 13/00
(52) U.S. Cl. ...................................... 714/775; 714/746
(58) Field of Search ................................ 714/775, 774, 714/701, 798, 746, 795, 786

(56) References Cited

U.S. PATENT DOCUMENTS 5,291,499 A 3/1994 Behrens et al.
6,194,916 B1 * 2/2001 Nishimura et al. ........... 327/12
6,252,465 B1 * 6/2001 Katoh .......................... 331/25
6,636,979 B1 * 10/2003 Reddy et al. ................ 713/503

FOREIGN PATENT DOCUMENTS

JP 9-8674 1/1997
JP 11-73740 3/1999

* cited by examiner

Primary Examiner—Phung M. Chung
(74) Attorney, Agent, or Firm—Oblon, Spivak, McCelland, Maier & Neustadt, P.C.

(57) ABSTRACT

A decoding technique is disclosed for proving inexpensively a read channel circuit which has an error correction function and is applicable to high channel frequencies. In this read channel circuit, generating a reference slice level signal and a plurality of slice level signals which are different from the reference slice level signal, converting the playback signal into a plurality of binary signals synchronized with a channel clock according to each of the slice level signals, selecting two binary signals, measuring the phase distance between the two binary signals, judging the polarity of an inverted edge of a reference binary signal, and generating an error correction signal on the basis of the phase distance and the polarity of the inverted edge of the reference binary signal, whereby any error in the playback signal can be eliminated.

16 Claims, 10 Drawing Sheets

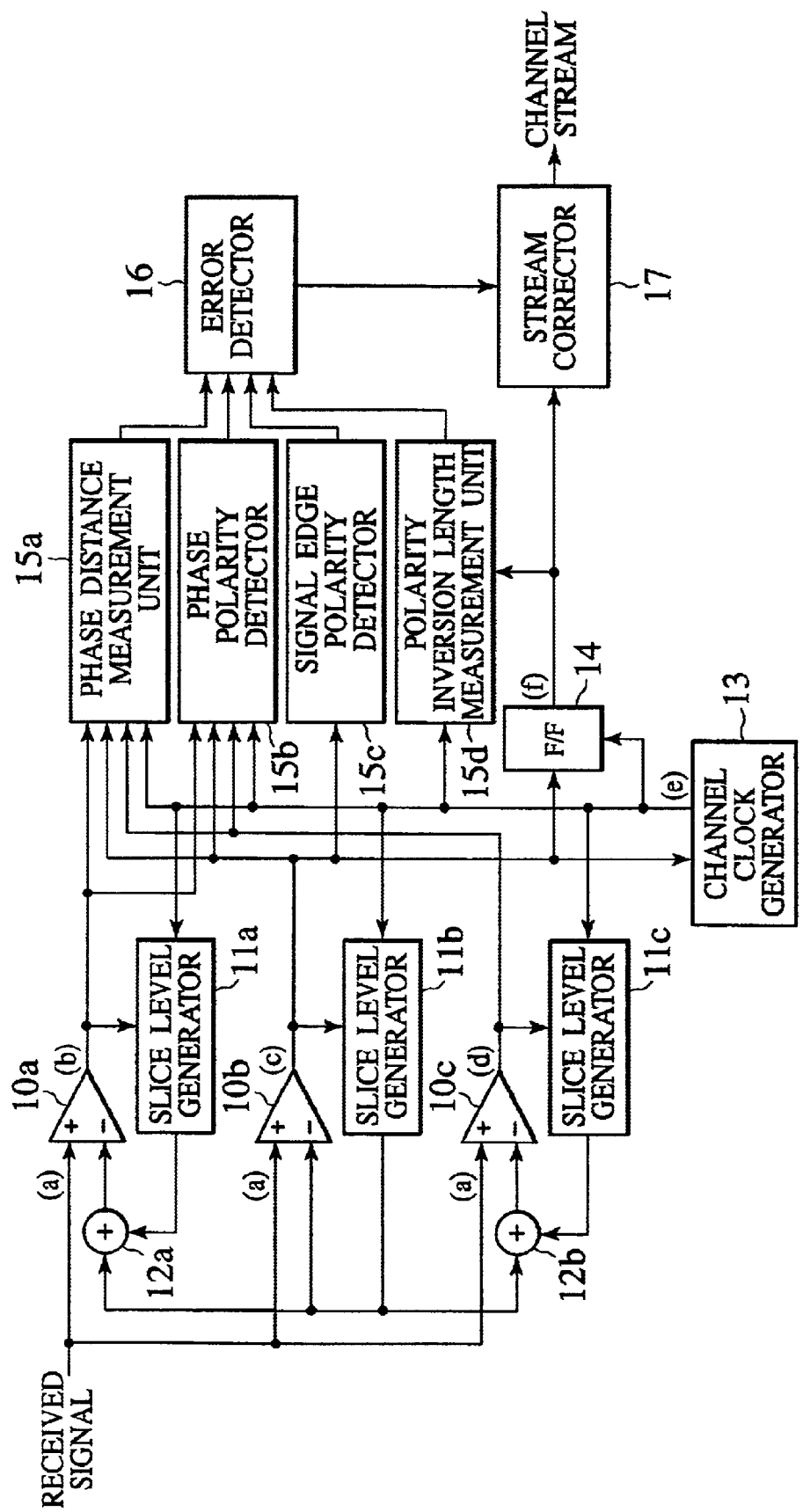

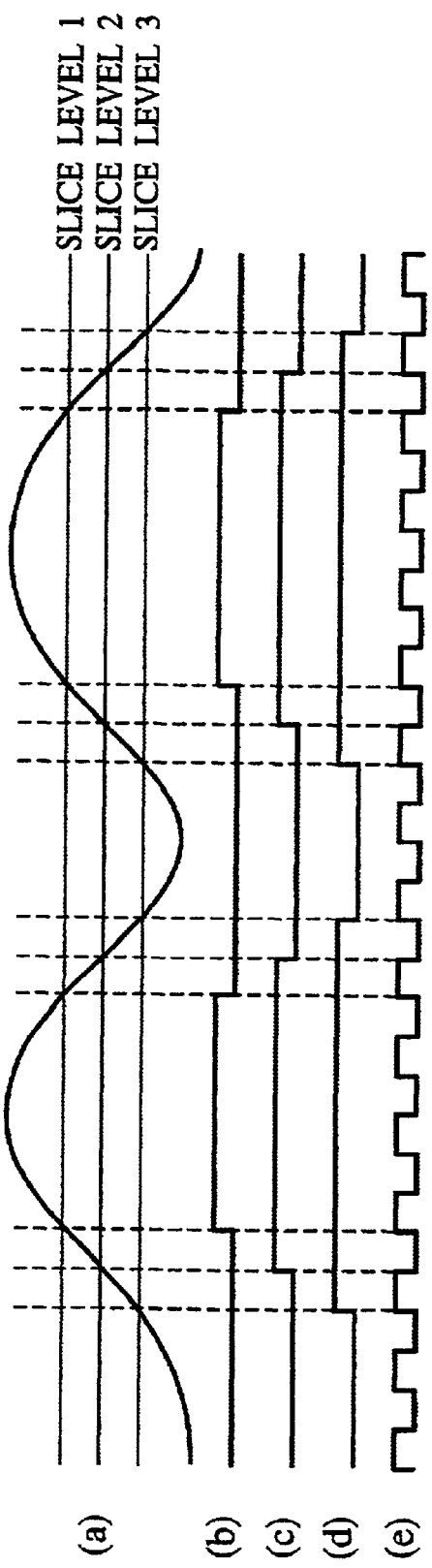

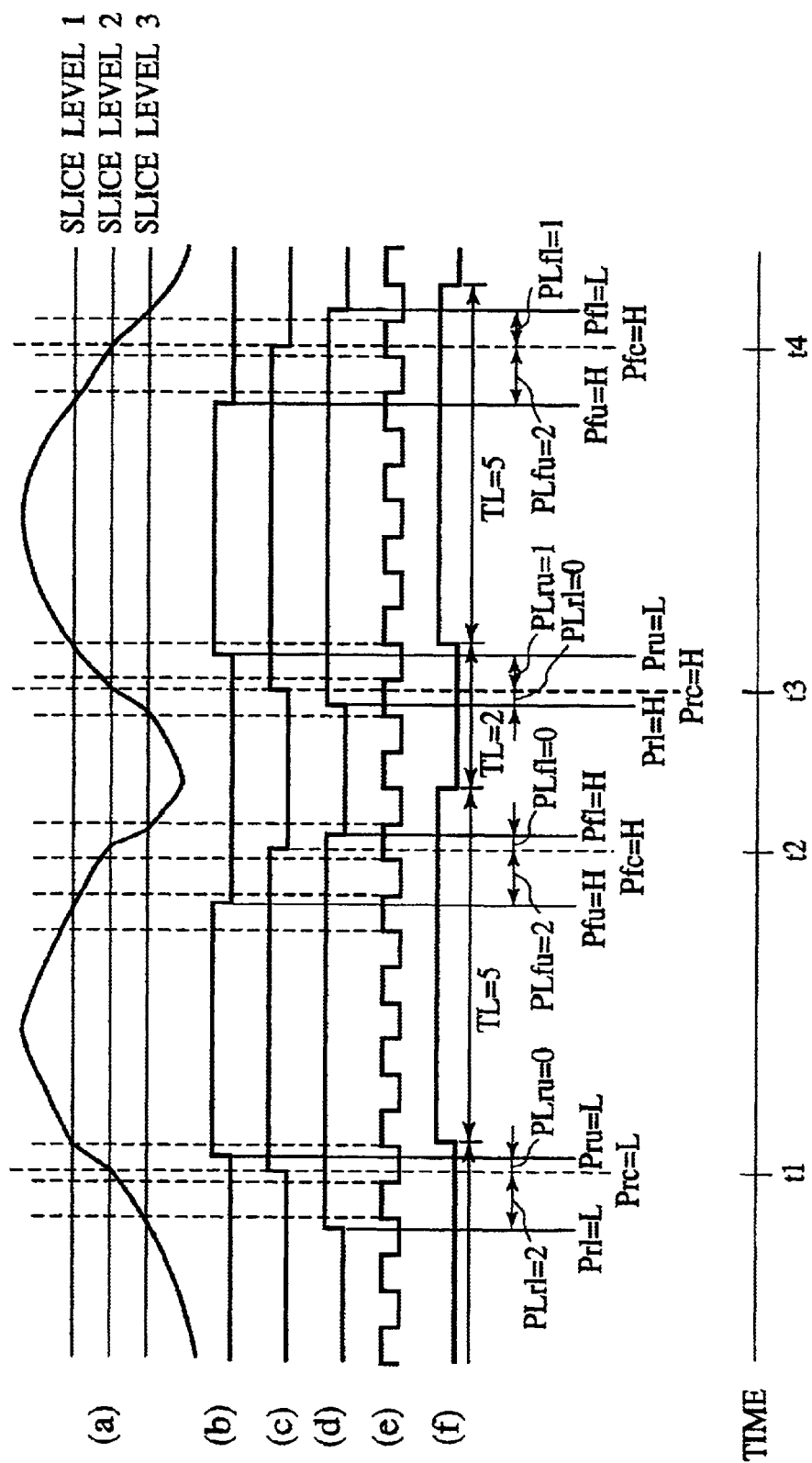

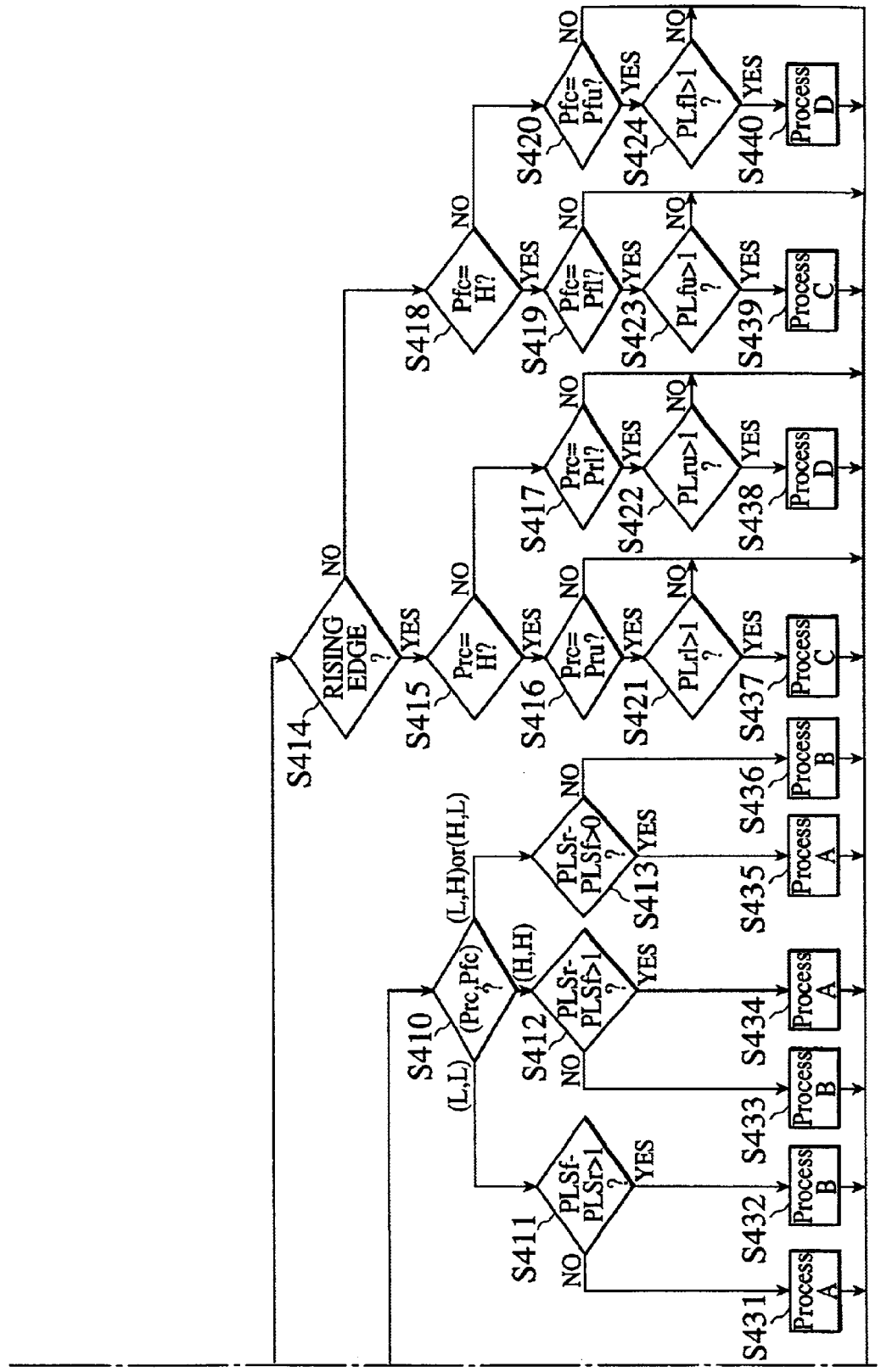
(FIG.8 CONTINUED)

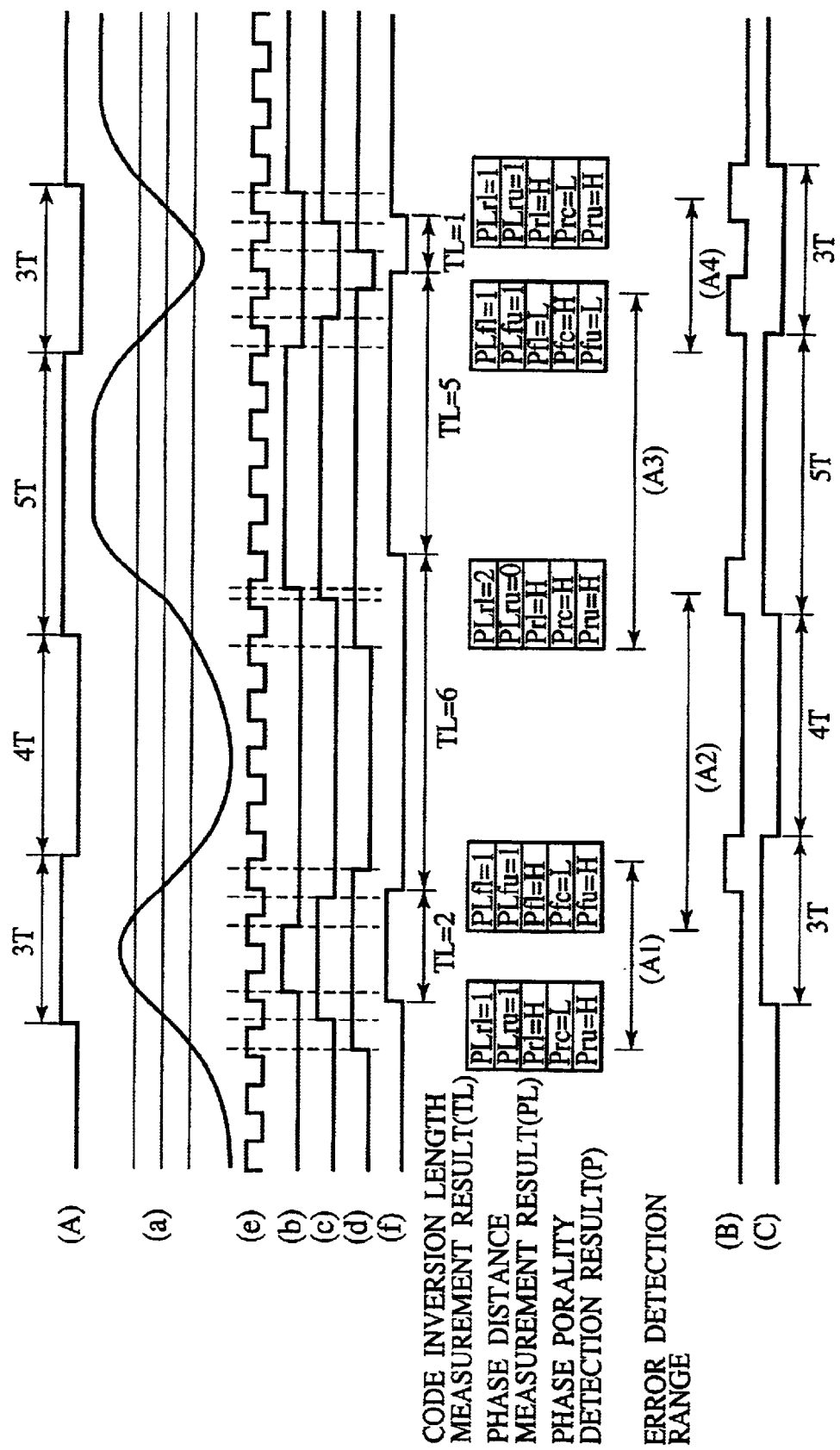

READ CHANNEL CIRCUIT AND METHOD FOR DECODING USING REDUCED-COMPLEXITY ERROR CORRECTION

CROSS-REFERENDE TO RELATED APPLICATIONS

This application is based upon and claims the benefit of priority from the prior Japanese Patent Application No.2000-283850, filed on Sep. 19, 2000; the entire contents of which are incorporated herein by reference in its entirety.

BACKGROUND OF THE INVENTION

1. Field of the Invention

The present invention relates to a read channel circuit and method for decoding using reduced-complexity error correction. More particularly, the present invention relates to a technology for providing a read channel circuit which has a decoding function applicable to high channel frequencies for decoding a modulated reception signal and is favorably applicable to an optical disk playback equipment such as a DVD, a CD-ROM, or a MD player.

2. Description of the Related Art

FIG. 1 illustrates a conventional read channel circuit applicable to a playback equipments such as a DVD player.

Such a conventional read channel circuit comprises, as shown in FIG. 1, a comparator 70, a slice level generator 71, a channel clock generator 72, and a flip-flop 73.

The comparator 70 is fed at the positive electrode (+) terminal and the negative electrode (−) terminal with a reception signal (a playback signal) received at the read channel and a slice level signal generated by the slice level generator 71, respectively. The output of the comparator 70 is a low (L) level signal when the input voltage level of the negative electrode is greater than that of the positive electrode, and is a high (H) level signal when the input voltage level of the negative electrode is lower than that of the positive electrode. Therefore, the output of the comparator 70 is a binary signal. The binary signal output of the comparator 70 is then transferred to the slice level generator 71, the channel clock generator 72, and the flip-flop 73.

The slice level generator 71 is responsive to the output signal from the comparator 70 for controlling the voltage of the slice level signal so as to have an average duty ratio of 50%.

The channel clock generator 72 generates a channel clock synchronized in phase with the binary signal from the comparator 70 and transfers the binary signal to a clock terminal of the flip-flop 73. The operation of the channel clock generator 72 shown in FIG. 1 synchronizes the polarity inverted phase of the binary signal with the falling edge phase of the channel clock and sets the duty ratio of the channel clock to 50%. The channel clock generator 72 may be implemented by a PLL (phase locked loop) circuit.

The flip-flop 73 samples the binary signal received at its data input terminal from the comparator 70 at the timing of each rising edge of the channel clock. A sampled signal output from the flip-flop 73 is then transferred as a channel stream signal to a given processor circuit provided at the succeeding stage of the flip-flop 73.

The conventional read channel circuit described above however has the following technical problems.

The technical problems in the conventional read channel circuit will now be described referring to FIG. 2. As shown in FIG. 2, denoted by (1) is a received signal which may represent a pattern of pits provided on a DVD disk. It is also assumed that the signal (1) is encoded by RLL (run-length limited coding) (2,10). In the RLL (2,10), the minimum code inverted length is 3T and the maximum code inverted length is 11T (T represents one channel cycle).

Also, a signal (2) is an ideal received signal from an optical playback path of DVD system as the transmission path. A signal (3) is a slice level signal. A signal (4) is a noise signal superimposed on the transmission path. A signal (5) is a received signal superimposed with the noise signal (4). A signal (6) is an ideal slice level signal. Note that the signal (5) is equivalent to a sum of the two signals (2) and (4).

A signal (7) is a binary signal outputted from the comparator 70 in response to the input of the signal (2). A signal (8) is another binary signal outputted from the comparator 70 in response to the input of the signal (5). A signal (9) is a channel clock synchronized with the signal (7) or (8). A signal (10) is a channel stream signal generated by decoding the signal (2). A signal (11) is another channel stream signal generated by decoding the signal (5).

As apparent from FIG. 2, the channel stream signal (10) from the decoding of the signal (2) is equal in the encoded form to the transmission signal (1) and can thus be decoded without any error. On the other hand, the channel stream signal (11) from the decoding of the signal (5) having noise components added is not equal in the encoded form to the transmission signal (1) as containing errors in the proximity of moments t2, t5, t7 and t8.

In other words, in the conventional read channel circuit, as the noises are superimposed at given levels and given moments on the transmission path, they may result in errors on the channel stream signal. The noises on the transmission path in a DVD player may derive from fault formation of pits, tilting of the optical axis of an optical pickup from the vertical to a disk surface, tracking error, or leak signals of any adjacent track in accordance with deviance in tracking control.

There is commonly proposed a scheme for adding an error correction code to a digital code signal which is carried along the transmission path failing to inhibit the introduction of noises.

Such a scheme may be favored when the number of errors developed on the channel stream signal stays within a range of the capability of error correction of the error correction code. However, if errors exceed the range, they will hardly be eliminated hence making the receive signal incorrect. Alternative technologies are thus desired for minimizing the development of errors on the channel stream prior to the step of error correction with the error correction code.

One of them is disclosed in Japanese Patent Laid-open Application No. PH9-8674 where the development of errors on the channel stream prior to the step of error correction is minimized by means of a maximum likelihood decoder using Viterbi algorithms.

FIG. 3 illustrates a read channel circuit equipped with the maximum likelihood decoder.

The read channel circuit with the maximum likelihood decoder shown in FIG. 3 comprises an analog/digital converter (ADC) 75, an adder 76, a slice level generator 77, a channel clock generator 78, and the maximum likelihood decoder 79.

The ADC 75 samples the received signal at the timing of the channel clock generated by the channel clock generator 78 and quantizes a sampled signal to data of a specific number of bits (for example, 8 bits) which is then transferred as a multi-level signal to the adder 76.

The adder 76 adds the multi-level signal from the ADC 75 with a slice level signal from the slice level generator 77 to have an offset multi-level signal which is transferred to the maximum likelihood decoder 79. Also, sign bit of the offset multi-level signal output of the adder 76 is transmitted to the slice level generator 77 and the channel clock generator 78.

The slice level generator 77 upon receiving the signal output from the adder 76 generates a slice level to have an average duty ratio of 50%. The slice level generator 77 and the adder 76 generates in a combination an auto slice signal which is received by both the channel clock generator 72 and the maximum likelihood decoder 79.

The channel clock generator 78 generates a channel clock synchronized in phase with the sign bit of the offset multi-level signal from the adder 76. The generated channel clock is transferred as a sampling clock signal to the ADC 75 and as an operating clock signal to the slice level generator 77 and the maximum likelihood decoder 79. The channel clock generator 78 may be implemented by a PLL circuit, for example.

The maximum likelihood decoder 79 decodes the received signal using Viterbi algorithms and its resultant decoded signal output is further transferred as a channel stream to a processing circuit provided at the succeeding step. A detailed procedure of the maximum likelihood decoding using Viterbi algorithms is disclosed in, for example, aforementioned Japanese Patent Laid-open Application No. PH9-8674.

However, the conventional read channel circuit when installed in a high-speed playback apparatus may develop the following technical problems.

In case of a DVD playback apparatus, the channel clock frequency reaches 420 MHz at a 16-fold playback speed, while 26.16 MHz at a so-called 1-fold playback speed and 420 MHz at a 16-fold speed. When the conventional read channel circuit is used for such a high-speed playback processing where the sampling of ADC is carried out by the channel clock as shown in FIG. 3, the sampling frequency of 420 MHz is required at the 16-fold speed. Also, with the conventional read channel circuit in the DVD playback apparatus, the number of quantizing bits in ADC is substantially eight.

This will increase the cost of the ADC using the foregoing sampling frequency and the quantizing bits as well as the power consumption and the heat generation. As a system LSI is equipped with the ADC of this type, its installation size will increase and its generation of heat will hardly be negligible. The above described technical problems will thus make it difficult to provide a low-cost DVD-ROM playback apparatus.

SUMMARY OF THE INVENTION

According to an aspect of the present invention, there is provided a read channel circuit for decoding a playback signal received from a prescribed transmission path which comprises: a slice level signal generator configured to generate a reference slice level signal and a plurality of slice level signals which are different from the reference slice level signal; a comparator configured to convert the playback signal into a plurality of binary signals synchronized with a channel clock and on the basis of each of the plurality of slice level signals generated; a phase distance measurement unit configured to select two binary signals from the plurality of binary signals and measure a phase distance which represents the number of edges in a prescribed clock between the edges of the two binary signals selected on the basis of the channel clock; an inverted edge detector configured to judge the polarity of an inverted edge of a reference binary signal binarized in accordance with the reference slice level signal among the plurality of binary signals; and an error corrector configured to generate an error correction signal to the playback signal on the basis of the phase distance measured and the polarity of the inverted edge of the reference binary signal detected to perform error correction on the playback signal.

According to another aspect of the present invention, there is provided a method of correcting an error in a playback signal received from a prescribed transmission path which comprises the steps of: generating a reference slice level signal and a plurality of slice level signals which are different from the reference slice level signal; converting the playback signal into a plurality of binary signals synchronized with a channel clock and on the basis of each of the plurality of slice level signals generated; selecting two binary signals from the plurality of binary signals and measuring a phase distance which represents the number of edges in a prescribed clock between the edges of the two binary signals selected on the basis of the channel clock; judging the polarity of an inverted edge of the reference binary signal binarized in accordance with the reference slice level signal among the plurality of binary signals; and generating an error correction signal to the playback signal on the basis of the phase distance measured and the polarity of the inverted edge of the reference binary signal judged to perform error correction.

Other features and advantages of the present invention will become apparent from the following description taken in conjunction with the accompanying drawings.

BRIEF DESCRIPTION OF THE DRAWINGS

The accompanying drawings, which are incorporated in and constitute a part of the specification, illustrate presently embodiment of the invention, and together with the general description given above and the detailed description of the preferred embodiments given below, serve to explain the principles of the invention.

FIG. 4 is a block diagram showing a configuration of a read channel circuit according to one embodiment of the present invention;

FIG. 5 is a timing chart illustrating operation of a slice level generator according to the embodiment of the present invention;

FIG. 6 is a timing chart illustrating operations of a phase distance measurement unit, a phase polarity detector, a signal edge polarity detector, and a polarity inverted length measurement unit according to the embodiment of the present invention;

FIG. 10 is a timing chart illustrating an overall operation of the read channel circuit according to the embodiment of the present invention.

DETAILED DESCRIPTION OF THE EMBODIMENT

Figure 1:
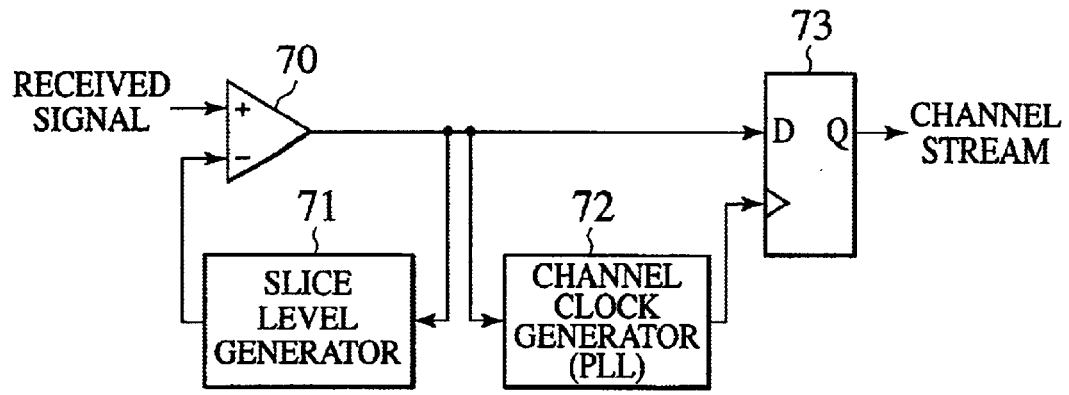
FIG. 1 is a block diagram showing a configuration of a conventional read channel circuit.
Figure 3:
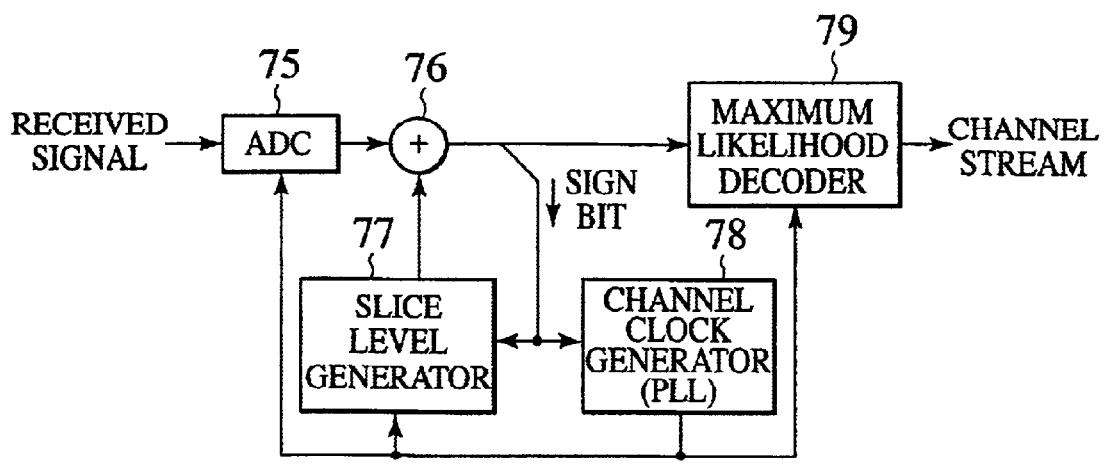
FIG. 3 is a block diagram showing a configuration of another conventional read channel circuit.

A read channel circuit and method for decoding using reduced-complexity error correction according to the present invention will be described in detail referring to FIGS. 4 to 10. Throughout the drawings, like components are denoted by like numerals.

This embodiment of the present invention provides a read channel circuit which has a maximum likelihood decoding function applicable to high channel frequencies and an error correction method for the read channel circuit.

According to this embodiment, errors in a received signal or a modified signal are estimated on the basis of the phase distance measured between two binary signals and can thus be corrected according to a result of the estimation. The read channel circuit according to the embodiment can be provided in reduced cost and applicable to high channel frequencies without the ADC.

For decoding a modulated signal generated by run-length limited modulation, errors in the channel stream obtained by the run-length limited modulation are eliminated. This allows the modulated signal to be properly corrected without producing any code of which the length is smaller than the minimum code inversion length.

The read channel circuit of this embodiment may be installed in a playback equipments for, e.g., DVD, CD-ROM, or MD disks.

Next, the configuration of the read channel circuit according to this embodiment and the operation of its components in a DVD player will now be described in more detail referring to FIGS. 4 to 10. The input signal received by the read channel circuit of this embodiment is described as a DVD playback signal modulated by RLL (2,10) (of which the minimum code inversion length is 3T and the maximum code inversion length is 11T), however, the modulation of input signal is not limited to this type of modulation.

First, the configuration of the read channel circuit according to this embodiment is explained.

The read channel circuit according to this embodiment comprises, as shown in FIG. 4, first, second, and third comparators 10a, 10b, and 10c, first, second, and third slice level generators 11a, 11b, and 11c, first and second adders 12a and 12b, a channel clock generator 13, a flip-flop (F/F) 14, a phase distance measurement unit 15a, a phase polarity detector 15b, a signal edge polarity detector 15c, a polarity inversion length measurement unit 15d, an error detector 16, and a stream corrector 17.

Each comparator is provided for comparing between a DVD playback signal received at its positive input terminal and a voltage level received at its negative input terminal. When the voltage level at the positive input terminal is higher than that at the negative input terminal, the output of the comparator is a binary signal at H level and when the voltage level at the positive input terminal is lower than that at the negative input terminal, at L level.

The binary outputs of the comparators are received by different components. The binary output from the comparator 10a is transferred to the slice level generator 11a, the phase distance measurement unit 15a, and the phase polarity detector 15b. The binary output from the comparator 10b is transferred to the slice level generator 11b, the phase distance measurement unit 15a, the phase polarity detector 15b, the signal edge polarity detector 15c, the flip-flop 14, and the channel clock generator 13. The binary output from the comparator 10c is transferred to the slice level generator 11c, the phase distance measurement unit 15a, to the phase polarity detector 15b.

The slice level generator 10b is responsive to the output signal from each comparator for controlling the voltage of the slice level signal to set the average duty ratio to 50%.

Signal outputs from the slice level generators are received by different components, respectively. The signal output of the slice level generator 11a is transferred to the adder 12a. The signal output of the slice level generation 11b is transferred to the comparator 10b and the two adders 12a and 12b. The signal output of the slice level generation 11c is transferred to the adder 12c.

The channel clock generator 13 generates a channel clock of which the falling edge is phase synchronized in phase with the polarity inverted phase of the output signal of the comparator 11b.

The generated channel clock is received by the phase distance measurement unit 15a, the phase polarity detector 15b, the polarity inversion length measurement unit 15d, the slice level generators 11a and 11c, and the flip-flop 14. Note that the channel clock generator 13 may be implemented by a PLL circuit. If desired, the channel clock may be used as an operating clock signal for timing the operation of the other components in the circuit.

The flip-flop 14 is operates using signal output form the slice level generator 11b as data and the clock signal from the channel clock generator 13 for sampling. More specifically, the flip-flop 14 samples the output signal from the slice level generator 11b at the timing of the rising edge of the channel clock from the channel clock generator 13 and its sampled channel signal is transferred to the polarity inversion length measurement unit 15d and the stream corrector 17.

The phase distance measurement unit 15a operates using the channel clock and signal output from comparators 10a, 10b and 10c for measuring the phase distance between the output signals from the comparators 10a, 10b, and 10c (as will be described later in more detail) and transferring its measurement result to the error detector 16.

The phase polarity detector 15b operates using the channel clock and the output signals from the comparators 10a, 10b, and 10c for detecting the phase polarity of the binary signal of each comparator and of the channel clock (as will be described later in more detail) and transferring a result of detection to the error detector 16.

The signal edge polarity detector 15c monitors the inverted edge of the output signal of the comparator 10b and examines whether the inverted edge is a rising edge or a falling edge. A result of its examination is received by the error detector 16.

The polarity inversion length measurement unit 15d operates with the channel clock for measuring the polarity inversion length of the output signal of the flip-flop 14 (as will be described later in more detail) and transfers its measurement result to the error detector 16.

The error detector 16 examines whether or not the received channel stream contains any error and a result of the examination is outputted for controlling the stream corrector 17, from the signal outputs of the phase distance measurement unit 15a, according to the phase polarity detector 15b, the signal edge polarity detector 15c, and the polarity inversion length measurement unit 15d.

The stream corrector 17 generates according to the error detection signal output of the error detector 16 a channel correction pulse for correcting the errors in the channel stream and the channel stream without errors can be outputted. In this embodiment, the error means a discrepancy from the ideal form of a signal and the above mentioned phase distance is used as a metric indicating the presence of an error.

Next, the operation of the read channel circuit according to this embodiment will now be described.

Referring to FIGS. 5 to 8, the operation of the read channel circuit of the embodiment is described in an order of I. the slice level generator, II. the phase distance measurement unit, phase polarity detector, signal edge polarity detector, and polarity inversion length measurement unit, and III. the error detector.

I. Operation of the Slice Level Generator

The operation of the slice level generator is described referring to FIG. 5. In FIG. 5, denoted by (a) are a received signal and three slice level signals. The slice level signals (1), (2), and (3) represent negative input signals to the corresponding comparators 10a, 10b, and 10c. Denoted by (b), (c), and (d) are the output signals from the three comparators 10a, 10b and 10c, respectively. Denoted by (e) is the generated channel clock. The signal waveforms shown in FIG. 5 are in their ideal phase.

As the received signal (that is, a playback signal) has been received by each comparator in the read channel circuit according to this embodiment, the slice level generator 11a generates a slice level offset signal so that the rising edge of the signal (e) just after a rising edge of the signal (c) coincides with the rising edge of the signal (b) at the rise of the received signal, and the rising edge of the signal (e) just before a falling edge of the signal (c) coincides with the falling edge of the signal (b) at the fall of the received signal, as described in the phase relationship between the two signals (b) and (e) in FIG. 5. The slice level offset signal is transferred to one of two inputs of the adder 12a.

Figure 2:
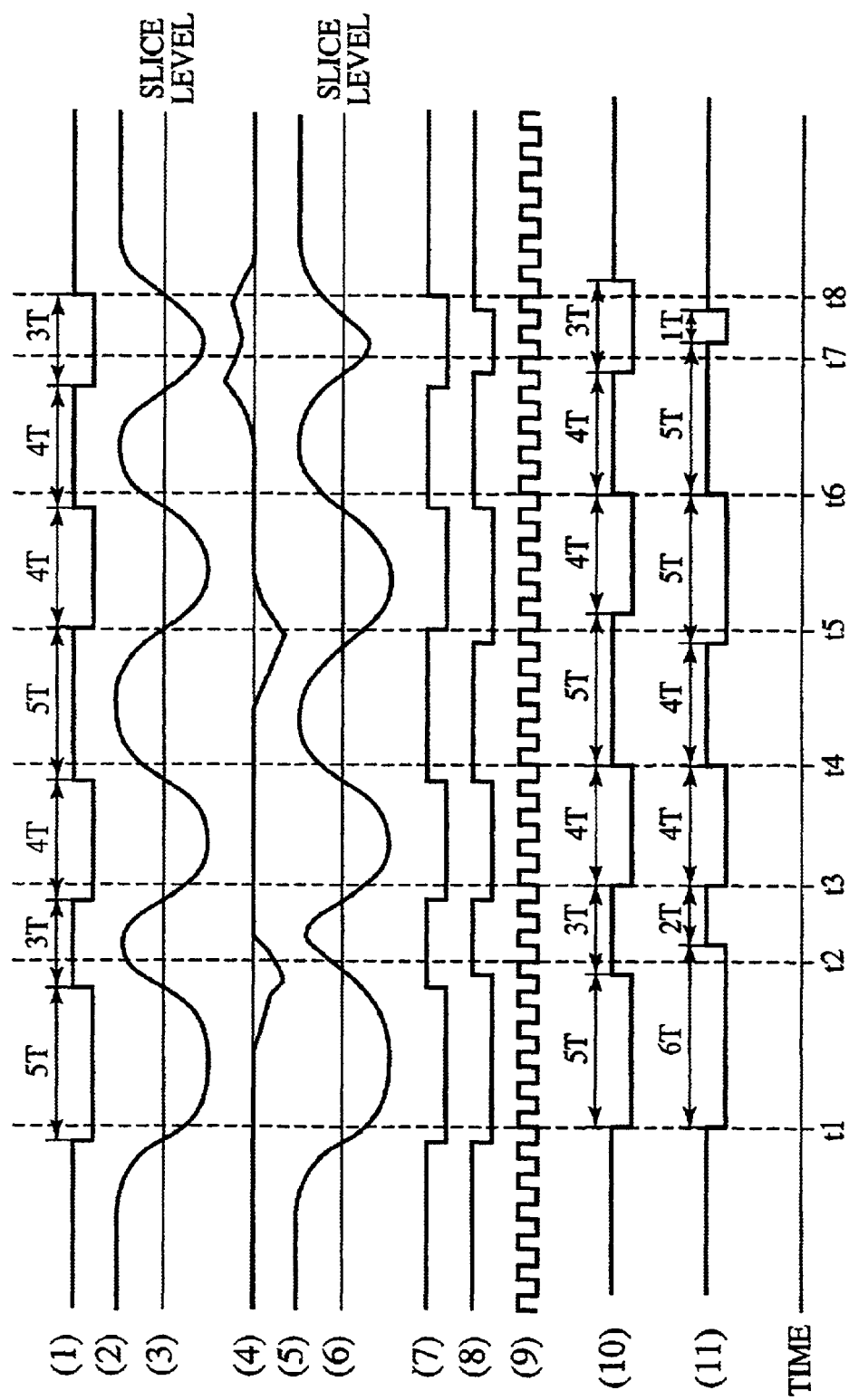
FIG. 2 is a timing chart illustrating operation of the conventional read channel circuit.

The adder 12a adds the slice level signal from the slice level generator 11b with the slice level offset signal from the slice level generator 11a to obtain a slice level signal having the slice level (1) shown in FIG. 2 which is then transferred to the negative input terminal of the comparator 10a.

On the other hand, the slice level generator 11c generates a slice level offset signal so that the rising edge of the signal (e) just before a falling edge of the signal (c) coincides in phase with the rising edge of the signal (d) at the rise of the received signal, and the rising edge of the signal (e) just before a falling edge of the signal (c) coincides in phase with the falling edge of the signal (b) at the fall of the received signal as denoted by the phase relationship between the two signals (d) and (e). The slice level offset signal is transferred to one of two inputs of the adder 12b.

The adder 12b adds the slice level signal from the slice level generator 11b with the slice level offset signal from the slice level generator 11c to obtain a slice level signal having the slice level (3) which is then transferred to the negative input terminal of the comparator 10c.

In this embodiment, the slice level offset signal generated by the slice level generator 11a or 11c is combined with the slice level signal generated by the slice level generator 11b to have the slice level (1) or (3) shown in FIG. 5. This is purposed for allowing the three slice level signals to operate in a combination for favorably tracing the behavior of the envelope of each playback signal. If such a purpose is not necessary, the slice level signals (1) and (3) may be generated directly by their respective slice level generators 11a and 11b.

II. Operation of the Phase Distance Measurement Unit, the Phase Polarity Detector, the Signal Edge Polarity Detector, and the Polarity Inversion Length Measurement Unit Next, the operation of the phase distance measurement unit, the phase polarity detector, the signal edge polarity detector, and the polarity inversion length measurement unit will now be described referring to FIG. 6. In FIG. 6, denoted by (a) are a received signal and three slice level signals. Denoted by (b), (c), and (d) are three output signals of the comparators 10a, 10b, and 10c respectively. Denoted by (e) is a generated channel clock. TL=n, PLrl=n, PLru=n, PLfu=n, PLfl=n, Prl, Prc, Pru, Pfu, Pfc, and Pfl are particular values as described below.

"TL=n" is a measurement result of the polarity inversion interval of the output signal fro the flip-flop 14. "PLrl=n" is a phase distance between the rising edge of the signal (d) and the rising edge of the signal (c) developed just after the rise edge of the signal (d). "PLru=n" is a phase distance between the rising edge of the signal (c) and the rising edge of the signal (b) developed just after the rising edge of the signal (c). "PLfu=n" is a phase distance between the falling edge of the signal (b) and the falling edge of the signal (c) developed just after the falling edge of the signal (b). "PLfl=n" is a phase distance between the falling edge of the signal (c) and the falling edge of the signal (d) developed just after the falling edge of the signal (c)."Prl" is a phase polarity at the rising edge of the signal (d). "Prc" is a phase polarity at the rising edge of the signal (c). "Pru" is a phase polarity at the rising edge of the signal (b). "Pfu" is a phase polarity at the falling edge of the signal (b). "Pfc" is a phase polarity at the falling edge of the signal (c). "Pfl" is a phase polarity at the falling edge of the signal (d).

It is assumed in this embodiment shown in FIG. 6 that while the slice level signals are appropriate, the received signal has noises loaded along the transmission path and its waveform is different from an ideal form.

In the read channel circuit according to this embodiment, the phase distance measurement unit 15a when receiving the output signals from the three comparators 10a, 10b, and 10c and the channel clock from the channel clock generator 13 measures the phase distance between the output signals of the comparators 10a, 10b and 10c on the basis of these signals and its measurement results are received by the error detector 16.

It is defined in this embodiment that the phase distance is expressed by the number of edges of the channel clock between any two adjacent edges of the signals to be measured. The phase distance is explained in more detail referring to FIG. 7A. As the channel clock has two edges between the two edges of the signals A and B, the phase distance is 2. Also, when the channel clock contains no edge, the phase distance is zero. When one edge is contained, the phase distance is 1.

Figure 7A:
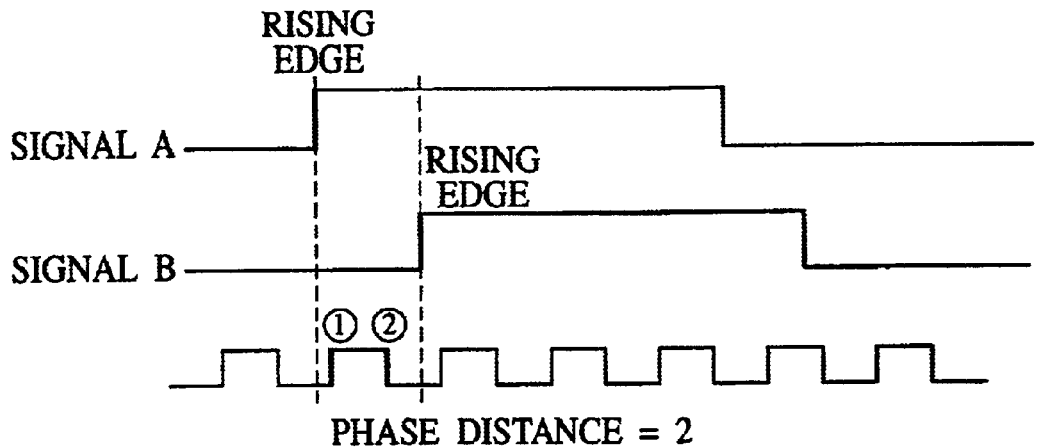
FIG. 7 is a schematic diagram illustrating the principles of phase distance, phase polarity, and polarity inverted length according to the embodiment of the present invention.
Figure 7B:
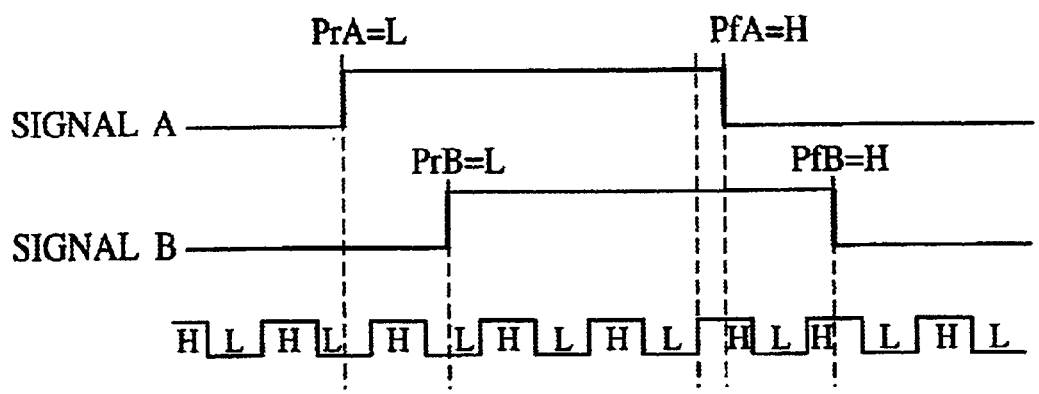

The phase polarity detector 15b examines the phase polarity on the basis of the channel clock and the output signals of the three comparators 10a, 10b, and 10c and a result of its examination is transferred to the error detector 16. The phase polarity indicates whether the start edge of polarity inversion of each binary signal corresponds to the H level or L level of the channel clock, as shown in FIG. 7B. When the start edge of polarity inversion of the binary signal is at the H level of the channel clock, the phase polarity is H. When the start edge of polarity inversion of the binary signal is at the L level of the channel clock, the phase polarity is L.

The signal edge polarity detector 15c monitors polarity inversion of the output signal of the comparator 10b and examines whether the start edge of polarity inversion of the output signal is a rising or a falling. A result of its examination is then received by the error detector 16. Referring to FIG. 7B, the point Pra of the signal A is a rising edge and the point Pfb is a falling edge.

Figure 7C:
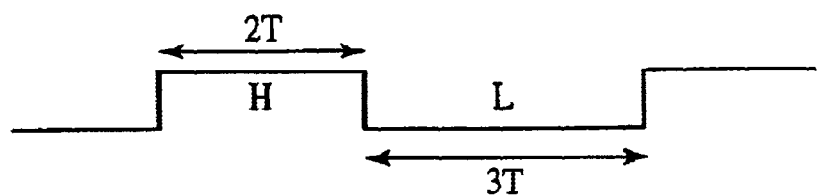

The polarity inversion length measurement unit 15d measures the length of polarity inversion of the output signal of the flip-flop 14 using the channel clock and its measurement result is transferred to the error detector 16. The polarity inversion length indicates the distance between two edges of polarity inversion interval as shown in FIG. 7C. In this embodiment, the polarity inversion length is based on a length unit T (one channel cycle).

III. Operation of the Error Detector

Next, the operation of the error detector will be described referring to FIGS. 8A and 8B.

Prior to the description of the error detector 16, an error detection algorithm used in the error correction method of the error detector 16 is first explained.

In case that the received signal is modulated by RLL (2,10) (where the minimum code inversion length being 3T, the maximum code inversion length being 11T, and T=one channel cycle), its decoded form of channel stream having less than a polarity inversion length of 3T (at the minimum code inversion length) is theoretically not provided. Accordingly, if the polarity inversion length measurement unit 15d judges that the measurement of polarity inversion length is less than the minimum code inverted length, in other words, the polarity inversion length is 1T or 2T in this embodiment, the presence of an error is detected. The channel stream having 1T or 2T of the polarity inversion length (less than the minimum code inversion length) is then subjected to the following error correction processing.

The error correction algorithm process when the polarity inversion length is 1T will be described.

When its polarity inversion length is 1T, it is judged that the channel stream should be theoretically is not less than 3T. Although 4T of the channel stream may erratically be identified as 1T, it is judged that 3T is decreased and misread as 1T at more probability. As a result, a stream corrected pulse is generated for increasing by 1T at each end of the channel stream interval.

Figure 9:
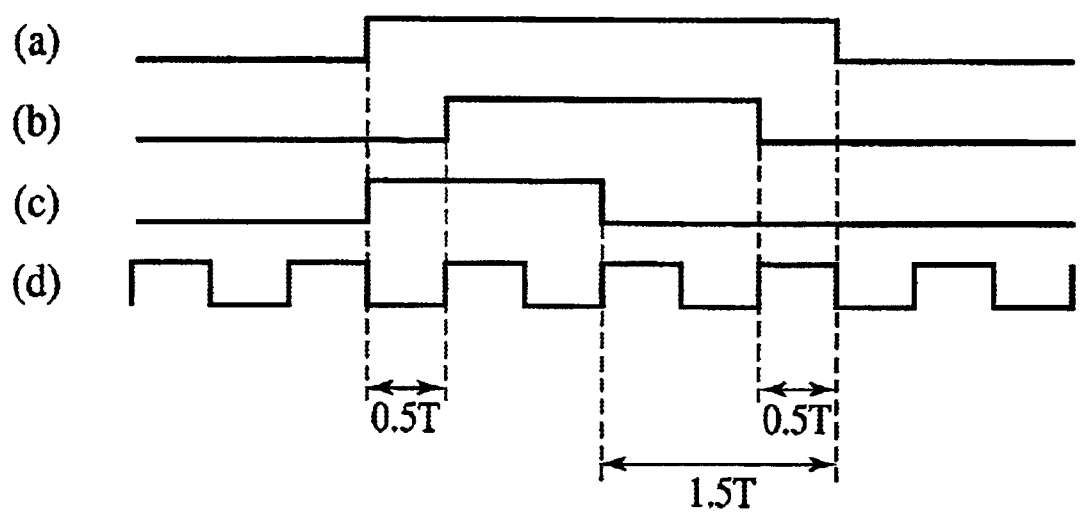
FIG. 9 is a schematic diagram illustrating stream correction pulse in the error correction method of the embodiment of the present invention.

The technical basis for generating a stream corrected pulse by extending 1T at each end of the channel stream period will be described referring to FIG. 9. In FIG. 9, denoted by (a) is a binary signal having ideal 3T pulses. Denoted by (b) is a binary signal having a pulse shortened at each end. Denoted by (c) is a binary signal having a pulse shortened at the trailing end. Denoted by (d) is a channel clock.

As the 3T of the channel stream is erroneously decreased to 1T, its pulse is shortened by 2T at the leading or trailing end or by 1T at each end. As apparent from FIG. 9, the signals (b) and (c) may be treated and decoded as a polarity inversion length of 1T when their pulse is slightly shortened. Assuming that the cycle of the channel clock is equal to a phase unit, a square error in the edge phase between the two signal (a) and (b) or (a) and (c) is 0.5 or 2.25. In view of the square error in the edge phase, it is more probable that the 3T is shortened by 1T at each end and thus misread as 1T. Accordingly, the error correction algorithm in this embodiment operates for increasing 1T at each end of the channel stream pulse to have a stream corrected pulse when the polarity inversion length is measured 1T.

Next, the error correction algorithm when the polarity inversion length is 2T will now be described.

When the polarity inversion length is measured 2T, it is more probable that 3T is decreased to 2T by shortening 1T at the leading or trailing end. However, the probability of shortening at the leading end is substantially equal to that at the trailing end and the judgment will hardly be made without further consideration. In the algorithm of this embodiment, two parameters "phase polarity" and "phase distance" are provided. Using the parameters, it can be judged whether the pulse is shortened at the leading end or the trailing end. This will be explained later in more detail.

Those are the error correction methods for the channel stream when the polarity inverted length is 1T and when 2T (both smaller than the minimum code inverted length).

On the other hand, in the error correction method of this embodiment, the generation of error may hardly be proved even when it is judged that the polarity inversion length is not smaller than 3T (the minimum code inversion length). As one polarity inverted point proximity in the received signal is picked up, its "phase polarity" and "phase distance" are measured for examining whether the polarity inverted phase has an error or not. When any error is found, the phase is shifted by 1T to develop a stream correction pulse.

Figure 8:
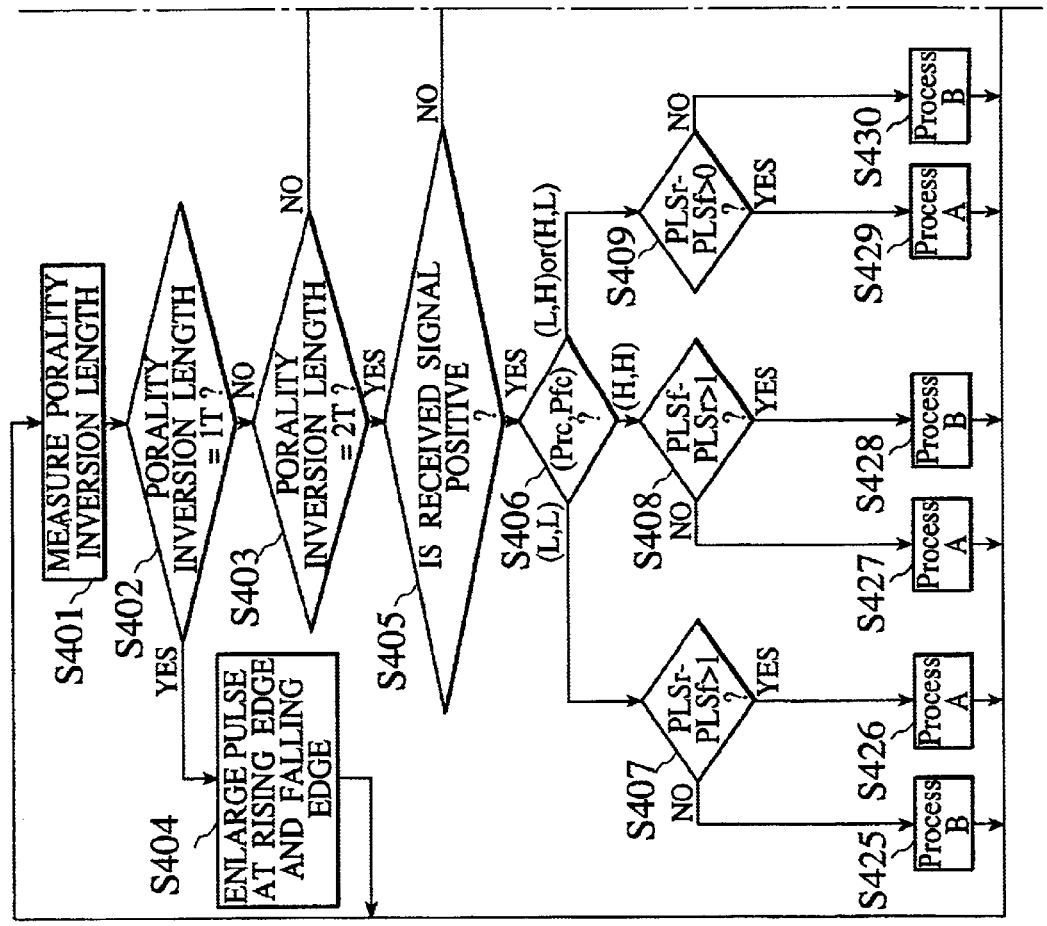
FIG. 8 is a flowchart showing a method of error correction according to the embodiment of the present invention.

Next, the operation of the error detector 16 using above mentioned error correction algorithm will be described in more detail referring to FIG. 8.

The error detector 16 in this embodiment is responsive to the output signals from the phase distance measurement unit 15a, the phase polarity detector 15b, the signal edge polarity detector 15c, and the polarity inversion length measurement unit 15d for carrying out the following processing.

(iii-1) The polarity inversion length measurement unit 15d operates with the channel clock for measuring the polarity inversion length of the output signal from the flip-flop 14 (S401).

(iii-2) The error detector 16 examines whether a measurement of the polarity inversion length is 1T or not (S402). If not, the procedure proceeds to a processing starting from S403. On the other hand, if the measurement is 1T, the error detector 16 controls the stream corrector 17 so that the pulse measured as 1T is increased by 1T at each end (of the two, rising and falling edges) to have a stream corrected pulse having 3T of the polarity inversion length (the minimum code inversion length) (S404).

(iii-3) If the polarity inversion length is not 1T, the error detector 16 further examines whether it is 2T or not (S403). If it is 2T, the procedure proceeds to a processing starting from S405 and if not, a processing starting from S414.

(iii-4) If the polarity inversion length is 2T, the error detector 16 examines the polarity of the received signal (S405). If the received signal is positive, the procedure proceeds to a processing starting from S406 and if negative, to a processing starting from S410.

(iii-5) If the received signal is positive, the error detector 16 examines Prc and Pft of the phase polarity on the basis of the output signal of the phase polarity detector 15b (S406). The procedure proceeds to S407 if (Prc,Pfc)=(L, L), to S408 if (Prc,Pfc)=(H,H), and to S409 if (Prc,Pfc)=(L,H) or (H,L).

(iii-6) If (Prc,Pfc)=(L,L), the error detector 16 examines whether PLSr–PLSf is greater than 1 or not (S407). If PLSr–PLSf is not greater than 1, the stream corrector 17 is operated for increasing the pulse by 1T at the falling edge to develop a stream corrected pulse (S425, referred to as a process B hereinafter), then the procedure returns back to S401. On the other hand, if PLSr−PLSf is greater than 1, the stream corrector 17 is operated for increasing the pulse by 1T at the rising edge to develop a stream corrected pulse (S426, referred to as a process A hereinafter), then the procedure returns back to S401. It is defined as PLSr=PLrl+PLru and PLSf=PLfl+PLfu.

(iii-7) When (Prc,Pfc)=(H,H), the error detector 16 examines whether PLSf−PLSr is greater than 1 or not (S408). If PLSf−PLSr is not greater than 1, the process A for increasing at the rising edge is carried out. On the other hand, if PLSf−PLSr is greater than 1, the process B for increasing at the falling edge is carried out. Then, the procedure returns back to S401.

(iii-8) If (Prc,Pfc)=(L,H) or (H,L), the error detector 16 examines whether PLSr−PLSf is greater than zero or not (S409). If PLSr−PLSf is not greater than zero, the process B is carried out. When PLSr−PLSf is greater than zero, the process A is carried out. Then, the procedure returns back to S401.

(iii-9) If the playback signal is negative, the error detector 16 examines the phase polarity of Prc and Pfc on the basis of the output of the phase polarity detector 15b (S410). The procedure then proceeds to S411 if (Prc,Pfc)=(L,L), to S412 if (Prc,Pfc)=(H,H), and to S413 if (Prc,Pfc)=(L,H) or (H,L).

(iii-10) If (Prc,Pfc)=(L,L), the error detector 16 examines whether PLSf−PLSr is greater than 1 or not (S411). When PLSf−PLSr is not greater than 1, the process A is carried out. On the other hand, if PLSf−PLSr is greater than 1, the process B is carried out. Then, the procedure returns back to S401.

(iii-11) If (Prc,Pfc)=(H,H), the error detector 16 examines whether PLSr−PLSf is greater than 1 or not (S412). If PLSr−PLSf is not greater than 1, the process B is carried out. On the other hand, if PLSr−PLSf is greater than 1, the process A is carried out. Then, the procedure returns back to S401.

(iii-12) If (Prc,Pfc)=(L,H) or (H,L), the error detector 16 examines whether PLSr−PLSf is greater than zero or not (S413). If PLSr−PLSf is not greater than zero, the process B is carried out. On the other hand, if PLSr−PLSf is greater than zero, the process A is carried out. Then, the procedure returns back to S401.

(iii-13) If the polarity inversion length is not 2T, the error detector 16 further examines on the basis of the result of polarity detection of the signal edge polarity detector 15c whether the edge of the stream is a rising edge or not (S414). If the edge is the rising edge, the procedure proceeds to a processing starting from S415 and if not, to a processing starting from S418.

(iii-14) If the edge of the channel stream is a rising edge, the error detector 16 examines Prc of the phase polarity on the basis of the result of phase polarity detection of the phase polarity detector 15b (S415). The procedure proceeds to a processing starting from S416 if Prc=H and to a processing starting from S417 if Prc≠H.

(iii-15) If Prc=H, the error detector 16 examines the phase polarity of Prc and Pru on the basis of the result of phase polarity detection of the phase polarity detector 15b (S416). If Prc and Pru are identical to each other, the procedure proceeds to a processing starting from S421. On the other hand, if not, the procedure returns back to S401.

(iii-16) If Prc and Pru are identical to each other, the error detector 16 examines whether PLrl is greater than 1 or not (S421) on the basis of the measurement result from the phase distance measurement unit 15a. If PLrl is greater than 1, the stream corrector 17 is operated for shifting the pulse by 1T in the direction of phase lead to develop a stream corrected pulse (S437, referred to as a process C hereinafter). On the other hand, if PLrl is not greater than 1, the procedure returns back to S401.

(iii-17) If Prc≠H, the error detector 16 examines the phase porality of Prc and Prl on the basis of the result of phase polarity detection of the phase polarity detector 15b (S417). If Prc and Prl are identical to each other, the procedure proceeds to a processing starting from S422. On the other hand, if not, the procedure returns back to S401.

(iii-18) If Prc and Prl are identical to each other, the error detector 16 examines whether PLru is greater than 1 or not (S422) on the basis of the measurement result from the phase distance measurement unit 15a. If PLru is greater than 1, the stream corrector 17 is operated for shifting the pulse by 1T in the direction of phase delay to develop a stream corrected pulse (S438, referred to as a process D hereinafter). On the other hand, if PLru is not greater than 1, the procedure returns back to S401.

(iii-19) If the stream edge is not a rising edge, the error detector 16 examines the phase polarity of Pfc on the basis of the result of phase polarity detection of the phase polarity detector 15b (S418). The procedure goes to a processing starting from S419 if Pfc=H or to a processing starting from S420 if fc≠H.

(iii-20) If Pfc=H, the error detector 16 examines the phase polarity of Pfc and Pfl on the basis of the result of phase polarity detection of the phase polarity detector 15b (S419). If Pfc and Pfl are identical to each other, the procedure then proceeds to a processing starting from S423. On the other hand, if not, the procedure returns back to S401.

(iii-21) If Pfc and Pfl are identical to each other, the error detector 16 examines on the basis of the result of phase distance of the phase distance measurement unit 15a whether PLfu is greater than 1 or not (S423). If Plfu is greater than 1, the procedure C for shifting the edge in the direction of phase lead is carried out. On the other hand, if not, the procedure returns back to S401.

(iii-22) If Pfc≠H, the error detector 16 examines the phase polarity of Pfc and Pfu on the basis of the result of phase polarity detection of the phase polarity detector 15b (S420). If Pfc and Pfu are identical to each other, the procedure then proceeds to a processing starting from S424. On the other hand, if not, the procedure returns back to S401.

(iii-23) If Pfc and Pfu are identical to each other, the error detector 16 examines on the basis of the result of phase distance of the phase distance measurement unit 15a whether PLfl is greater than 1 or not (S424). If PLfl is greater than 1, the procedure D for shifting the edge in the direction of phase delay is carried out. On the other hand, if not, the procedure returns back to S401.

As described above, the read channel circuit and its error correction method of the present embodiment allows any error in a received or playback signal to be estimated on the basis of the phase distance measured between binary signals and errors can be corrected using the result of estimation. The read channel circuit can hence be less expensive while applicable to high channel frequencies without using an ADC, as compared with a conventional read channel circuit.

More specifically when the minimum polarity inversion length is 3T in this embodiment, it can be judged which ends of the polarity inverted pulse 2T of a channel stream signal is increased by an extension. Also, in case that the polarity inversion length of the channel stream is not less than 3T, its error can be estimated and thus eliminated for error correction.

Note that the error correction method of this embodiment may be stored in a program form on a computer-readable recording medium. For starting the error correction process, the program is read out from the recording medium and saved in a storage such as a memory in the computer. As the error correction program is executed by an operating device in the computer, its method of the present embodiment can favorably be performed. Characteristic examples of the recording medium are a semiconductor memory, a magnetic disk, an optical disk, an optomagnetic disk, a magnetic tape, and other computer-readable recording mediums.

Finally, the operation of the read channel circuit of the present embodiment will be described referring to FIG. 10. In FIG. 10, denoted by (A) is a transmission stream signal which is modulated by RLL (2,10). Also, denoted by (a) are received signal and slice level signals. The received signal contains a noise component superimposed and its waveform is far from its ideal shape. Denoted by (e) is a generated channel clock, denoted by (b), (c), and (d) are signal outputs of the comparators 10a, 10b, and 10c respectively, and denoted by (f) is an output signal from the flip-flop. Denoted by TL, PL, and P are measurement results of the code inversion length, the phase distance, and the phase polarity, respectively. Denoted by (B) is a stream correction pulse and denoted by (C) is a corrected channel stream signal. As the output of the signal edge polarity detector is easily specified from the signal (f), it is not shown. In the actual operation of the circuit, the error detection has to be timed with a delay. For simplification of the description, the streams correction pulse (B) and the channel stream signal (C) are illustrated without delay of time.

As apparent from FIG. 10, the channel stream signal generated by the stream corrector 17 in this embodiment is substantially equivalent to the transmission signal (A). This proves that the channel stream signal superimposed with noise components has duly been corrected.

Next, the process of generating stream correction pulses in an error detecting span using the error correction algorithm will now be described referring to FIG. 8.

When the result of measurement at S401 is 2 in the error detection interval A1, the procedure proceeds from S402 to S403 and S405. As the received signal is positive (S406) with Prc and Pfc at the L level, the procedure goes to S407. Also, as PLSr=2 and PLSf=2 are measured, the process B is carried out to develop a stream corrected pulse increased by 1T at the falling edge.

In the error detection interval A2, the measurement at S401 is 6 and the procedure goes from S402 to S403 and S414. As the received signal is at the rising edge, the procedure proceeds to S415. Moreover, as Prc is at the H level, the procedure goes to S416. As Prc=Pru=H is established, the procedure further proceeds to S421. As PLrl=2 is measured, the process C is carried out. In the process C, a stream correction pulse is generated by shifting the pulse by 1T in the direction of lead.

In the error detection interval A3, the measurement at S401 is 1 and the procedure goes from S402 to S404. At S404, a stream correction pulse is generated for increasing the pulse by 1T at each end.

In summary, the read channel circuit and its error correction method of the present embodiment can provide an inexpensive read channel arranged applicable to high channel frequencies.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A read channel circuit for decoding a playback signal received from a prescribed transmission path, comprising:

a slice level signal generator configured to generate a reference slice level signal and a plurality of slice level signals which are different from the reference slice level signal;

a comparator configured to convert the playback signal into a plurality of binary signals synchronized with a channel clock on the basis of each of the plurality of slice level signals generated;

a phase distance measurement unit configured to select two binary signals from the plurality of binary signals and measure a phase distance which represents the number of edges in a prescribed clock between the edges of the two binary signals selected;

an inverted edge detector configured to detect the polarity of an inverted edge of a reference binary signal binarized in accordance with the reference slice level signal among the plurality of binary signals; and an error corrector configured to generate an error correction signal to the playback signal on the basis of the phase distance measured and the polarity of the inverted edge of the reference binary signal detected to perform error correction on the playback signal.

2. The read channel circuit according to claim 1, wherein said slice level generator generates a slice level offset signal synchronized with the polarity inverted edge of the channel clock which is adjacent to the polarity inverted edge of the reference binary signal binarized in accordance with the reference slice level signal.

3. The read channel circuit according to claim 2, further comprising:

an adder configured to add the slice level offset signal and the reference slice level signal and output a resultant sum to said comparator.

4. The read channel circuit according to claim 1, further comprising:

a channel clock polarity detector configured to judge the polarity of the channel clock corresponding to the polarity inverted edge of each of the binary signals according to the channel clock, wherein said error corrector generates an error correction signal according to the channel clock polarity.

5. The read channel circuit according to claim 1, further comprising:

a polarity inversion length measurement unit configured to measure a polarity inversion length which represents a distance between the inverted edges of the binary signal to detect a discrepancy in the minimum polarity inversion length of the playback signal, wherein said error corrector generates different error correction signal according to the polarity inversion length.

6. The read channel circuit according to claim 1, wherein the number of the slice level signals generated by said slice level generator is at least three.

7. The read channel circuit according to claim 1, wherein
said error corrector selects two binary signals from the plurality of binary signals according to the inverted edge polarity of the reference binary signal and compares the phase distance and the phase polarity between the selected two binary signals to generate an error correction signal.

8. The read channel circuit according to claim 1, wherein
the playback signal is modulated by run-length limited modulation system and its polarity inversion length is not less than the minimum polarity inverted length m, and
said error corrector generates an error correction signal when the polarity inverted length is not less than m.

9. A method of correcting an error in a playback signal received from a prescribed transmission path, comprising:
generating a reference slice level signal and a plurality of slice level signals which are different from the reference slice level signal;
converting the playback signal into a plurality of binary signals synchronized with a channel clock according to each of the plurality of slice level signals generated;
selecting two binary signals from the plurality of binary signals and measuring a phase distance which represents the number of edges in a prescribed clock between the edges of the two binary signals selected;
judging the polarity of an inverted edge of a reference binary signal binarized in accordance with the reference slice level signal among the plurality of binary signals; and
generating an error correction signal to the playback signal according to the phase distance and the polarity of the inverted edge of the reference binary signal to perform error correction on the playback signal.

10. The method according to claim 9, wherein
said slice level signal generating generates a slice level offset signal synchronized with the polarity inverted edge of the channel clock which is adjacent to the polarity inverted edge of the reference binary signal binarized in accordance with the reference slice level signal.

11. The method according to claim 10, further comprising:
adding the slice level offset signal and the reference slide level signal.

12. The method according to claim 9, further comprising:
judging the polarity of the channel clock corresponding to the polarity inverted edge of each of the binary signals according to the channel clock, wherein
said error correction signal generating generates an error correction signal according to the channel clock polarity.

13. The method according to claim 9, further comprising:
measuring the polarity inversion length which is a distance between the inverted edges of the binary signal to detect a discrepancy in the minimum polarity inversion length of the playback signal, wherein
said error correction signal generating generates different error correction signals according to measurements of the polarity inversion length.

14. The method according to claim 9, wherein
the number of the slice level signals generated in said slice level generating is at least three.

15. The method according to claim 9, wherein
said error correction signal generating selects two binary signals from a plurality of binary signals according to the inverted edge polarity of the reference binary signal and compares the phase distance between the two binary signals and the phase polarity to generate an error correction signal.

16. The method according to claim 9, wherein
the playback signal is modulated by run-length limited modulation system and its polarity inversion length is not less than the minimum polarity inversion length m, and
said error correction signal generating generates different error correction signals when the polarity inverted length is not less than m.

* * * * *